United States Patent
Kang et al.

(10) Patent No.: US 9,148,235 B1
(45) Date of Patent: Sep. 29, 2015

(54) EYE DIAGRAM MEASURING CIRCUIT AND MEASURING METHOD THEREOF

(71) Applicants: GLOBAL UNICHIP CORPORATION, Hsinchu (TW); TAIWAN SEMICONDUCTOR MANUFACTURING CO., LTD, Hsin-Chu (TW)

(72) Inventors: Wen-Juh Kang, Tainan (TW); Yen-Chung Chen, Sunnyvale, CA (US); Liang-Hung Chen, Hsinchu (TW)

(73) Assignees: GLOBAL UNICHIP CORPORATION, Hsinchu; TAIWAN SEMICONDUCTOR MANUFACTURING CO., LTD, Hsin-Chu (*) Notice: Subject to any disclaimer, the term of this patent is extended or adjusted under 35 U.S.C. 154(b) by 0 days.

(21) Appl. No.: 14/486,077

(22) Filed: Sep. 15, 2014

(51) Int. Cl.
*H04B 3/46* (2015.01)
*H04L 7/00* (2006.01)
*H03D 3/24* (2006.01)
*H04B 17/10* (2015.01)
*H04L 5/00* (2006.01)
*G01R 31/317* (2006.01)

(52) U.S. Cl.
CPC ............ *H04B 17/104* (2015.01); *H04L 5/0048* (2013.01); *H04L 7/0037* (2013.01); *G01R 31/3171* (2013.01)

(58) Field of Classification Search
CPC ......... H04L 1/205; H04L 7/033; H04L 1/203; H04L 7/0338; G01R 31/31709; G01R 31/3191; G01R 31/3171; H04B 10/07953; H03M 1/1255; H03L 7/0807; H03L 7/091
USPC ......................... 375/224–227, 371, 355, 373
See application file for complete search history.

(56) References Cited

U.S. PATENT DOCUMENTS

| | | | |
|---|---|---|---|
| 8,243,782 B2 | 8/2012 | Mobin et al. | |
| 8,249,207 B1 * | 8/2012 | Hissen et al. | 375/355 |
| 2004/0120426 A1 * | 6/2004 | Dagdeviren et al. | 375/340 |
| 2007/0247181 A1 * | 10/2007 | Ishida et al. | 324/765 |
| 2013/0272358 A1 * | 10/2013 | Chen et al. | 375/224 |

* cited by examiner

*Primary Examiner* — Tesfaldet Bocure
(74) *Attorney, Agent, or Firm* — WPAT, PC; Justin King

(57) ABSTRACT

An eye diagram measuring circuit includes a reference signal generator, a clock data recovery circuit, a test signal generator, and a boundary determining unit. The reference signal generator generates a reference signal. The clock data recovery circuit generates a clock signal according to the reference signal. The test signal generator generates a first sampling signal according to the clock signal. The test signal generator discriminates logic levels of plural bits of the input signal according to the first sampling signal and a slicing voltage, thereby generating a test signal. The boundary determining unit generates a boundary of an eye diagram according to a relationship between the test signal and the reference signal. The test signal generator changes a phase of the first sampling signal and a magnitude of the slicing voltage according to plural conditions provided by the boundary determining unit.

11 Claims, 5 Drawing Sheets

EYE DIAGRAM MEASURING CIRCUIT AND MEASURING METHOD THEREOF

FIELD OF THE INVENTION

The present invention relates to a circuit and a measuring method thereof, and more particularly to an eye diagram measuring circuit and a measuring method thereof.

BACKGROUND OF THE INVENTION

A serializer/deserializer (also referred as SERDES) is usually used in high speed communications. By the SERDES architecture, a parallel data is converted into a serial data in a transmitting device, and the serial data is restored to the parallel data in a receiving device. The SERDES architectures are widely used in high-speed storage interface such as SATA interfaces, SAS (Serial SCSI) interfaces, USB 2.0/3.0 interfaces, PCI-e interfaces, HDMI interfaces, XAUI interfaces, 10G interfaces or fiber-optic interfaces.

FIG. 1 is a schematic functional block diagram illustrating a conventional SERDES architecture. For example, the conventional SERDES architecture is disclosed in U.S. Pat. No. 8,243,782. As shown in FIG. 1, the conventional SERDES architecture includes a transmitting device 61, a receiving device 65, and a channel 63. A serial data (in) is transmitted from a transmitter 61a of the transmitting device 61 to a receiver 65a of the receiving device 65 through the channel 63. In particular, after the serial data is equalized by a transmitter equalizer (Tx equalizer) 61b of the transmitter 61a, a transmitting signal is outputted. After the transmitting signal is transmitted through the channel 63, the transmitting signal is an input signal of the receiving device 65.

The receiver 65a of the receiving device 65 includes a receiver equalizer and sampler (RX equalizer and sampler) 651, a measuring circuit 653, and an adaptive controller 655. However, while the transmitting signal passes through the channel, the transmitting signal is usually affected by inter-symbol Interferences (ISI), insertion loss or return loss. Consequently, after a serial data (out) is recovered from the input signal by the RX equalizer and sampler 651, the serial data (out) has to be corrected according to the measured signal quality.

For evaluating the quality of the input signal, the equalized input signal is further measured by the measuring circuit 653 of the receiver 65a. The measuring result is transmitted from the measuring circuit 653 to the adaptive controller 655. According to the measuring result, the adaptive controller 655 will judge whether the settings of the receiving device 61 and the receiving device 65 have to be adjusted or not.

For example, if the measuring result from the measuring circuit 653 indicates that the quality of the input signal is unqualified, the adaptive controller 655 generates an adjusted signal. The adjusting signal is fed back to the RX equalizer and sampler 651 of the receiver 65a and the Tx equalizer 61b of the transmitter 61a. According to the adjusting signal, the settings of the RX equalizer and sampler 651 of the receiver 65a and the Tx equalizer 61b of the transmitter 61a are correspondingly adjusted.

After the settings of the RX equalizer and sampler 651 of the receiver 65a and the Tx equalizer 61b of the transmitter 61a are adjusted, a corresponding new input signal is measured by the measuring circuit 653, and a new measuring result is generated by the measuring circuit 653. Similarly, if the measuring result indicates that the quality of the input signal is unqualified, the adaptive controller 655 generates a new adjusted signal again. The new adjusting signal is fed back to the RX equalizer and sampler 651 of the receiver 65a and the Tx equalizer 61b of the transmitter 61a again. The above procedures are repeatedly done until the measuring result from the measuring circuit 653 indicates that the quality of the input signal is qualified.

Generally, the bit error rate (BER) is a parameter indicating the quality of a received signal of a system. According to many high-speed transmission standards, the bit error rate should be lower than an expectation value. For example, the allowable bit error rate of the SERDES system is lower than $10^{-12}$; and the allowable bit error rate of the fiber-optic system is lower than $10^{-15}$. In the SERDES architecture of FIG. 1, the input signal is repeatedly measured, the adjusting signal is repeatedly fed back to the transmitter 61a and the receiver 65a, and the settings of the transmitter 61a and the receiver 65a are repeatedly adjusted. Consequently, the quality of the input signal can meet the BER requirement.

However, it is necessary for the measuring circuit 653 to efficiently and accurately measure the quality of the input signal in order to meet the BER requirement. If the quality of the input signal is not efficiently and accurately measured, the process of adjusting the settings of the transmitter 61a and the receiver 65a is either inefficient or incorrect.

SUMMARY OF THE INVENTION

An embodiment of the present invention provides an eye diagram measuring circuit. The eye diagram measuring circuit includes a reference signal generator, a clock data recovery circuit, a test signal generator, and a boundary determining unit. The reference signal generator receives and samples an input signal and generates a reference signal. The clock data recovery circuit generates a clock signal according to the reference signal. The test signal generator receives the clock signal and the input signal, and generates a first sampling signal according to the clock signal. The test signal generator discriminates logic levels of plural bits of the input signal according to the first sampling signal and a first slicing voltage, thereby generating a corresponding test signal. The boundary determining unit receives the test signal and the reference signal, and generates a boundary of an eye diagram according to a relationship between the test signal and the reference signal. Moreover, the boundary determining unit provides plural conditions to the test signal generator, and the test signal generator changes a phase of the first sampling signal and a magnitude of the first slicing voltage according to the plural conditions.

Another embodiment of the present invention provides an eye diagram measuring method for an eye diagram measuring circuit. The eye diagram measuring circuit includes a reference signal generator for converting an input signal into a reference signal. The eye diagram measuring method includes steps of providing plural sampling phase offsets to a test signal generator, and changing a phase of a sampling signal according to the plural sampling phase offsets. When each of the plural sampling phase offsets is provided to the test signal generator, an edge searching process is performed. The edge searching process includes the following steps. In a step (a), a first initial of the slicing voltage offset is provided to the test signal generator. In a step (b), a slicing voltage according to the slicing voltage offset is generated, and logic levels of plural bits of the input signal are discriminated according to the sampling signal and the slicing voltage. Consequently a corresponding test signal is generated. Then, a step (c) is performed to judge whether the test signal and the reference signal are identical. If the test signal and the reference signal are identical, a summation of the slicing voltage offset and an increment step is used to update the slicing voltage offset, wherein if the test signal and the reference signal are not identical, a difference between the slicing voltage offset and the increment step is used to update the slicing voltage offset. Then, a step (d) is performed to judge whether a magnitude of the increment step is larger than a first threshold. If the magnitude of the increment step is larger than the first threshold, the magnitude of the increment step is reduced and then the step (b) is repeatedly done. If the magnitude of the increment step is smaller than or equal to the first threshold, the updated slicing voltage offset is a first edge of an eye diagram.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

As known, an eye diagram is widely used to evaluate the quality of an input signal. Generally, the bit error rate is related to the coverage area of the boundary of the eye diagram. The larger coverage area of the boundary of the eye diagram indicates the better quality of the input signal. As the quality of the input signal is enhanced, the bit error rate of the input signal is correspondingly reduced.

Figure 1:
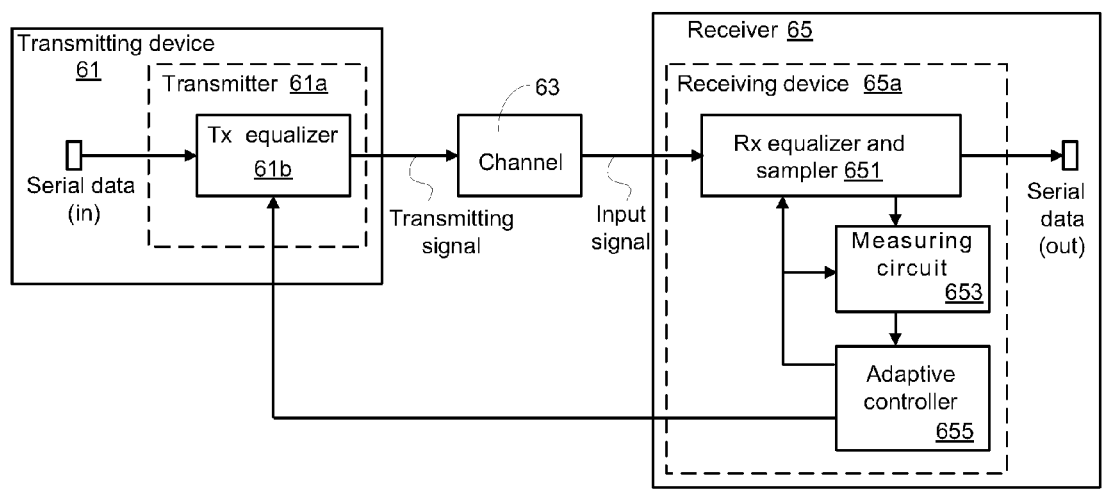
FIG. 1 (prior art) is a schematic functional block diagram illustrating a conventional SERDES architecture.
Figure 2:
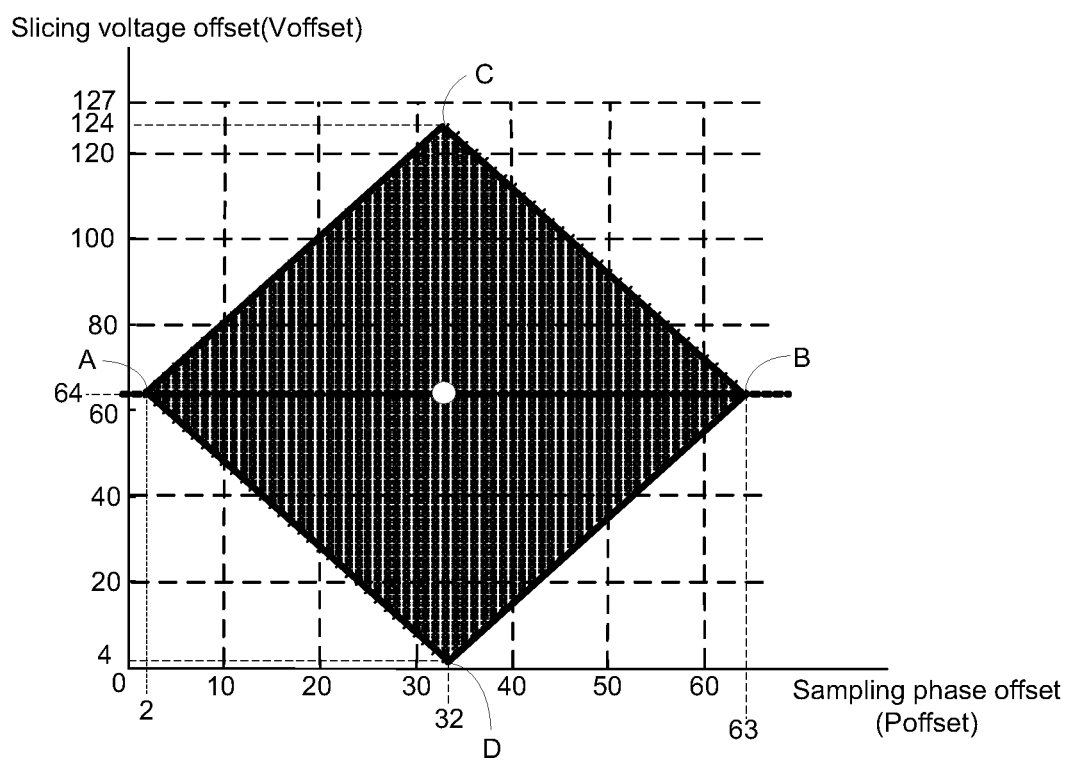
FIG. 2 schematically illustrates an eye diagram.

FIG. 2 schematically illustrates an eye diagram. The X graduations in the horizontal direction indicate different sampling phase offsets Poffset, and the Y graduations in the vertical direction indicate different slicing voltage offsets Voffset. As shown in FIG. 2, the sampling phase offsets Poffset are 0~63, and the slicing voltage offsets Voffset are 0~127. In other words, if the 64 sampling phase offsets Poffset may result in (−180-180)-degree delay of the sampling signal, each interval between sampling phase offsets Poffset results in (360/64)-degree delay of the sampling signal. The 128 slicing voltage offsets Voffset can be used to discriminate the logic levels of all serial bits of the input signal. For example, if the amplitude of the input signal is 1V, each interval between slicing voltage offsets Voffset is ($1/128$)V.

For example, if the sampling phase offset Poffset is 32, the phase of the sampling signal is delayed 0 degrees. Moreover, if the slicing voltage offset Voffset is 64, the slicing voltage is 0.5V. That is, all serial bits of the input signal are sampled at the 0-degree phase, and the logic levels of all serial bits are determined according to the relationship between the sampled amplitude and the slicing voltage (0.5V). If the sampled amplitude is higher than the slicing voltage (0.5V), this bit is considered to have a high logic level. Whereas, if the sampled amplitude is lower than the slicing voltage (0.5V), this bit is considered to have a low logic level.

In FIG. 2, the shade region is the eye diagram, and the thicker solid lines are the boundary of the eye diagram. All sampling phase offsets Poffset and all slicing voltage offsets Voffset of the eye diagram may be used as the conditions of discriminating the input signals and accurately distinguishing from all logic levels of the input signal.

Please refer to FIG. 2 again. In the condition A, the sampling phase offset Poffset is 2, and the slicing voltage offset Voffset is 64. The condition A can be used to accurately distinguish from all logic levels of the input signal. Moreover, in the condition B, the sampling phase offset Poffset is 63, and the slicing voltage offset Voffset is 64. The condition B can be used to accurately distinguish from all logic levels of the input signal. In other words, if the slicing voltage offset Voffset is 64, the sampling phase offsets Poffset in the range between 2 and 63 can be used to accurately distinguish from all logic levels of the input signal.

In the condition C, the sampling phase offset Poffset is 32, and the slicing voltage offset Voffset is 124. The condition C can be used to accurately distinguish from all logic levels of the input signal. Moreover, in the condition D, the sampling phase offset Poffset is 32, and the slicing voltage offset Voffset is 4. The condition D can be used to accurately distinguish from all logic levels of the input signal. In other words, if the sampling phase offsets Poffset is 32, the slicing voltage offsets Voffset in the range between 4 and 124 can be used to accurately distinguish from all logic levels of the input signal.

From the above discussions, the condition A indicates a left edge of the eye diagram, the condition B indicates a right edge of the eye diagram, condition C indicates an upper edge of the eye diagram, and the condition D indicates a bottom edge of the eye diagram. Moreover, the conditions including all sampling phase offsets Poffset and all slicing voltage offsets Voffset of the eye diagram can be used to accurately distinguish from all logic levels of the input signal. Consequently, the boundary of the eye diagram is important to the high-speed transmission architecture of the serializer/deserializer.

Figure 3:
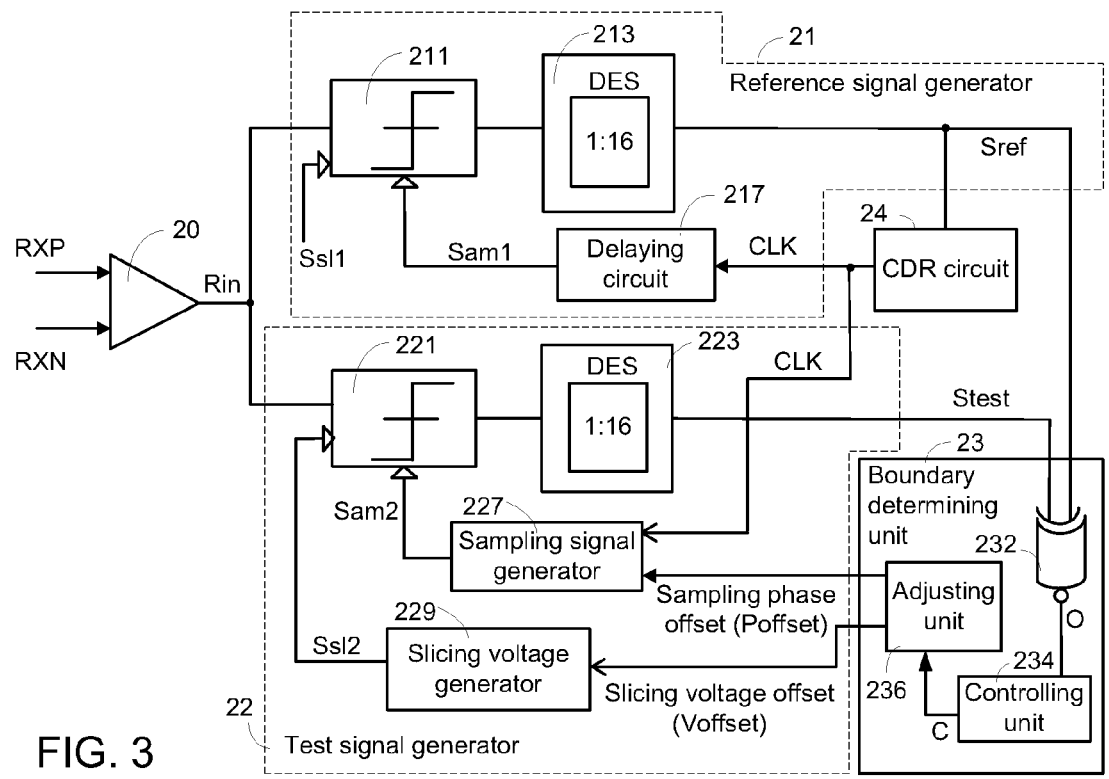
FIG. 3 schematically illustrates an eye diagram measuring circuit according to an embodiment of the present invention.

FIG. 3 schematically illustrates an eye diagram measuring circuit according to an embodiment of the present invention. After a differential signal (RXP–RXN) is received by a receiving unit 20 of the eye diagram measuring circuit, an input signal Rin is generated. Alternatively, in some other embodiments, the input signal is generated after a single ended signal is received by the receiving unit of the eye diagram measuring circuit.

As shown in FIG. 3, the eye diagram measuring circuit includes a reference signal generator 21, a test signal generator 22, a clock data recovery circuit (also referred as a CDR circuit) 24, and a boundary determining unit 23.

The reference signal generator 21 includes a first sampler 211, a first deserializer (DES) 213, and a delaying circuit 217. The delaying circuit 217 receives a clock signal CLK and generates a first sampling signal Sam1 to the first sampler 211. According to the first sampling signal Sam1 and a first slicing signal Ssl1, the first sampler 211 samples the input signal Rin and determines the logic levels of all serial bits of the input signal Rin.

After the logic levels of consecutive M bits (e.g. 16 bits) of the input signal Rin are sampled by the first sampler 211, the serial M bits are converted into a parallel form by the first deserializer 213. Consequently, a reference signal Sref is generated.

Basically, the reference signal generator 21 has to accurately determine the logic levels of all serial bits of the input signal Rin. Consequently, the logic levels of all serial bits of the input signal Rin are determined by the first sampler 211 according to the first slicing signal Ssl1 with a fixed magnitude and the first sampling signal Sam1 with a fixed delay phase. For example, if the magnitude of the first slicing signal is a half of the amplitude of the input signal Rin, a 0-degree delay of the clock signal CLK by the delaying circuit 217 may generate the first sampling signal Sam1. In this condition, the accuracy of the logic levels of all serial bits of the input signal Rin and the accuracy of the reference signal Sref can be assured.

Moreover, according to the reference signal Sref, the clock signal CLK matching the input signal Rin is acquired by the clock data recovery circuit 24.

The test signal generator 22 includes a second sampler 221, a second deserializer (DES) 223, a sampling signal generator 227, and a slicing signal generator 229. The sampling signal generator 227 receives the clock signal CLK, and generates a second sampling signal Sam2 according to the sampling phase offset Poffset. The slicing signal generator 229 generates a second slicing voltage Ssl2 according to the slicing voltage offset Voffset. Moreover, according to the second sampling signal Sam2 and the second slicing voltage Ssl2, the second sampler 221 samples the input signal Rin and determines the logic levels of all serial bits of the input signal Rin. After the logic levels of the consecutive M bits of the input signal Rin are sampled by the second sampler 221, the serial M bits are converted into a parallel form by the second deserializer 223. Consequently, a test signal Stest is generated.

The boundary determining unit 23 includes a judging unit 232, a controlling unit 234, and an adjusting unit 236. During a detecting cycle of the boundary of the eye diagram (also referred as an eye diagram boundary), the judging unit 232 judges whether the test signal Stest and the reference signal Sref are identical, and issues a result signal O to the controlling unit 234. According to the result signal O, the controlling unit 234 issues a control signal C to the adjusting unit 236. According to the control signal, the sampling phase offset Poffset and the slicing voltage offset Voffset are adjusted by the adjusting unit 236. After the detecting cycle of the eye diagram boundary is ended, the eye diagram boundary is determined by the controlling unit 234.

In an embodiment, the judging unit 232 is an exclusive OR circuit (XOR circuit). If the test signal Stest and the reference signal Sref are identical, the result signal O has a low logic level. Whereas, if the test signal Stest and the reference signal Sref are not identical, the result signal O has a high logic level.

In other words, during the detecting cycle of the eye diagram boundary, the sampling phase offset Poffset and the slicing voltage offset Voffset are continuously adjusted by the boundary determining unit 23. Consequently, the test signal Stest is correspondingly adjusted by the test signal generator 22. Moreover, the boundary determining unit 23 continuously compares the test signal Stest with the reference signal Sref, thereby determining the eye diagram boundary.

In case that the simplest but the most lengthy eye diagram measuring method is adopted, the boundary determining unit 23 may sequentially generate 64 sampling phase offsets Poffset and 128 slicing voltage offsets Voffset to the test signal generator 22, and determines the eye diagram boundary according to the relationship between the test signal Stest and the reference signal Sref. However, for obtaining the eye diagram boundary, this measuring method has to generate 64×128 kinds of conditions to the test signal generator 22.

In addition to the above measuring method, the controlling unit 234 of the boundary determining unit 23 may use another appropriate algorithm to accelerate searching the eye diagram boundary.

Figure 4:
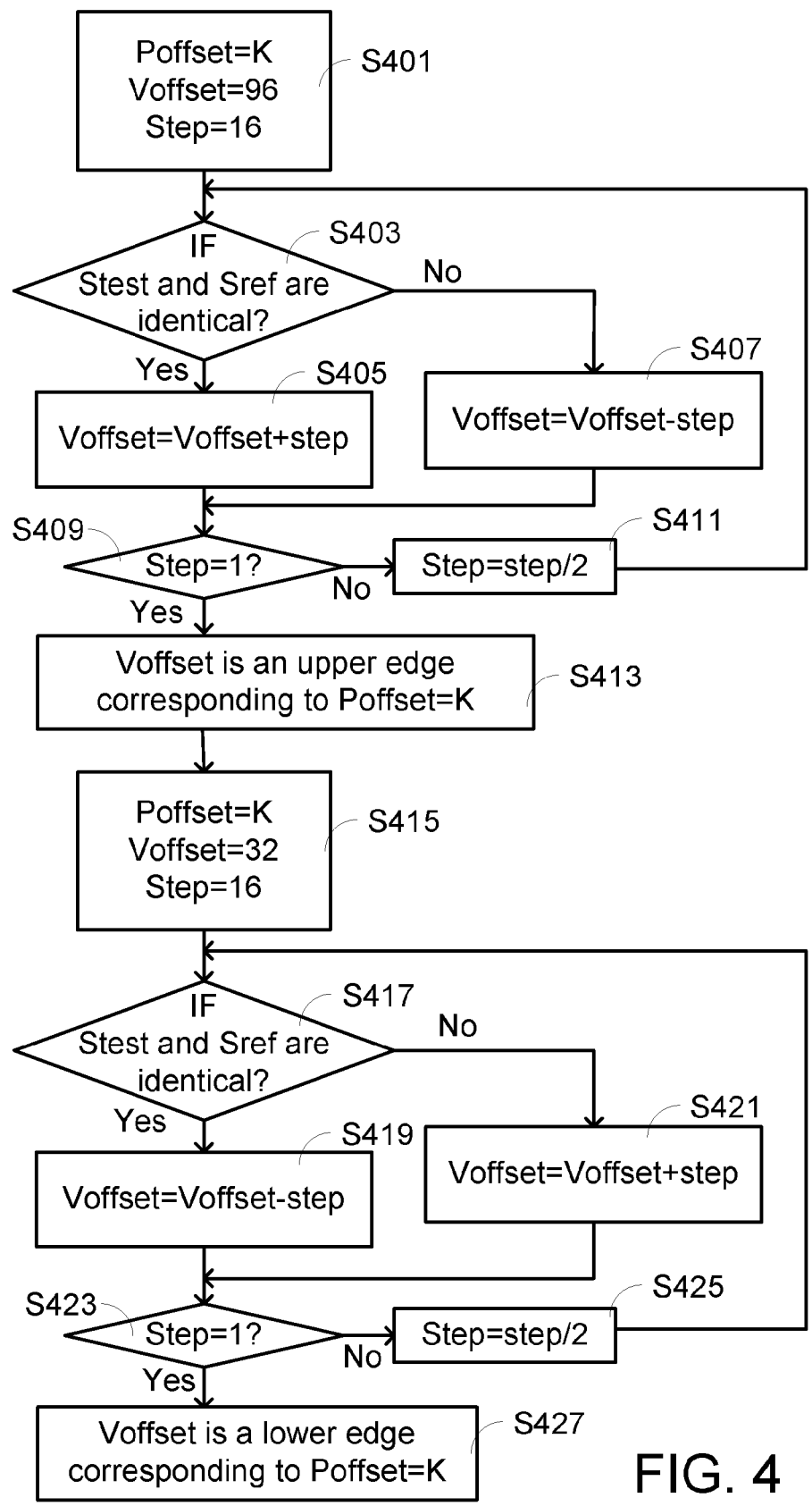
FIG. 4 is a flowchart illustrating an eye diagram measuring method for the eye diagram measuring method according to an embodiment of the present invention.

FIG. 4 is a flowchart illustrating an eye diagram measuring method for the eye diagram measuring method according to an embodiment of the present invention. The eye diagram measuring method uses a binary search method to accelerate searching the eye diagram boundary. Hereinafter, the eye diagram measuring method will be illustrated by referring to 64 sampling phase offsets Poffset and 128 slicing voltage offsets Voffset. It is noted that the numbers of the sampling phase offsets Poffset and the slicing voltage offsets Voffset are presented herein for purpose of illustration and description only.

Firstly, a first initial condition is provided (Step 401). In the first initial condition, the sampling phase offset Poffset is K, the slicing voltage offset Voffset is 96, and an increment step is 16.

Then, the first initial condition is provided to the test signal generator 22, and the step S403 is performed to judge the relationship between the test signal Stest and the reference signal Sref. If the test signal Stest and the reference signal Sref are identical, it means that this condition lies within the eye diagram boundary. Under this circumstance, the summation of the slicing voltage offset Voffset and the increment step is used to update the slicing voltage offset Voffset (Step S405).

Whereas, if the test signal Stest and the reference signal Sref are not identical, it means that this condition is outside the eye diagram boundary. Under this circumstance, the difference between the slicing voltage offset Voffset and the increment step is used to update the slicing voltage offset Voffset (Step S407).

After the step S405 or the step S407, the step S409 is performed to judge whether the increment step is 1. If the increment step is not equal to 1, it means that the upper edge has not been searched. Under this circumstance, the quotient from the division of the increment step by 2 is used as a new increment step (Step S411). Meanwhile, a new condition includes the original sampling phase offset Poffset (=K), the updated slicing voltage offset Voffset and the new increment step. Then, the step S403 is repeatedly done.

Once the increment step is equal to 1, it means that the upper edge has been searched. Consequently, the updated slicing voltage offset Voffset is an upper edge corresponding to the sampling phase offset Poffset (=K) (Step S413).

Next, a second initial condition is provided (Step 417). In the second initial condition, the sampling phase offset Poffset is K, the slicing voltage offset Voffset is 32, and an increment step is 16.

Then, the second initial condition is provided to the test signal generator 22, and the step S417 is performed to judge the relationship between the test signal Stest and the reference signal Sref. If the test signal Stest and the reference signal Sref are identical, it means that this condition lies within the eye diagram boundary. Under this circumstance, the difference between the slicing voltage offset Voffset and the increment step is used to update the slicing voltage offset Voffset (Step S419).

Whereas, if the test signal Stest and the reference signal Sref are not identical, it means that this condition is outside the eye diagram boundary. Under this circumstance, the summation of the slicing voltage offset Voffset and the increment step is used to update the slicing voltage offset Voffset (Step S421).

After the step S419 or the step S421, the step S423 is performed to judge whether the increment step is 1. If the increment step is not equal to 1, it means that the lower edge has not been searched. Under this circumstance, the quotient from the division of the increment step by 2 is used as a new increment step (Step S425). Meanwhile, a new condition includes the original sampling phase offset Poffset (=K), the updated slicing voltage offset Voffset and the new increment step. Then, the step S417 is repeatedly done.

Once the increment step is equal to 1, it means that the lower edge has been searched. Consequently, the updated slicing voltage offset Voffset is a lower edge corresponding to the sampling phase offset Poffset (=K) (Step S427).

After the upper edge and the lower edge corresponding to the sampling phase offset Poffset (=K) have been determined, the sampling phase offset Poffset may be changed to (K+1). After the above procedure of FIG. 4 is repeatedly performed, the upper edge and the lower edge corresponding to the sampling phase offset Poffset (=K+1) are obtained. In other words, after the 64 sampling phase offsets Poffset are provided and the procedure of FIG. 4 is performed 64 times, the upper edges and the lower edges corresponding to all sampling phase offsets Poffset are obtained. All of the upper edges and the lower edges are collaboratively defined as the eye diagram boundary.

In case that the slicing voltage offsets Voffset of the upper edge and the lower edges corresponding to a specified sampling phase offsets Poffset are identical, the specified sampling phase offset Poffset is located at the left edge or the right edge of the eye diagram. That is, the specified sampling phase offset Poffset is equivalent to the condition A or the condition B of the eye diagram of FIG. 2. In other words, it is not necessary to determine the upper edge and the lower edge corresponding to the slicing voltage offset Voffset at the left side of the condition A or the slicing voltage offset Voffset at the right side of the condition B.

From the above discussions about the flowchart of FIG. 4, the steps S401~S413 indicate an upper edge searching process, the steps S415~427 indicate a lower edge searching process. Generally, even if the upper edge searching process and the lower edge searching process are exchanged, the identical searching results are obtained. Moreover, if only the upper edges or the lower edges of the eye diagram are intended to be searched, only the upper edge searching process or only the lower edge searching process needs to be repeatedly done.

Figure 5:
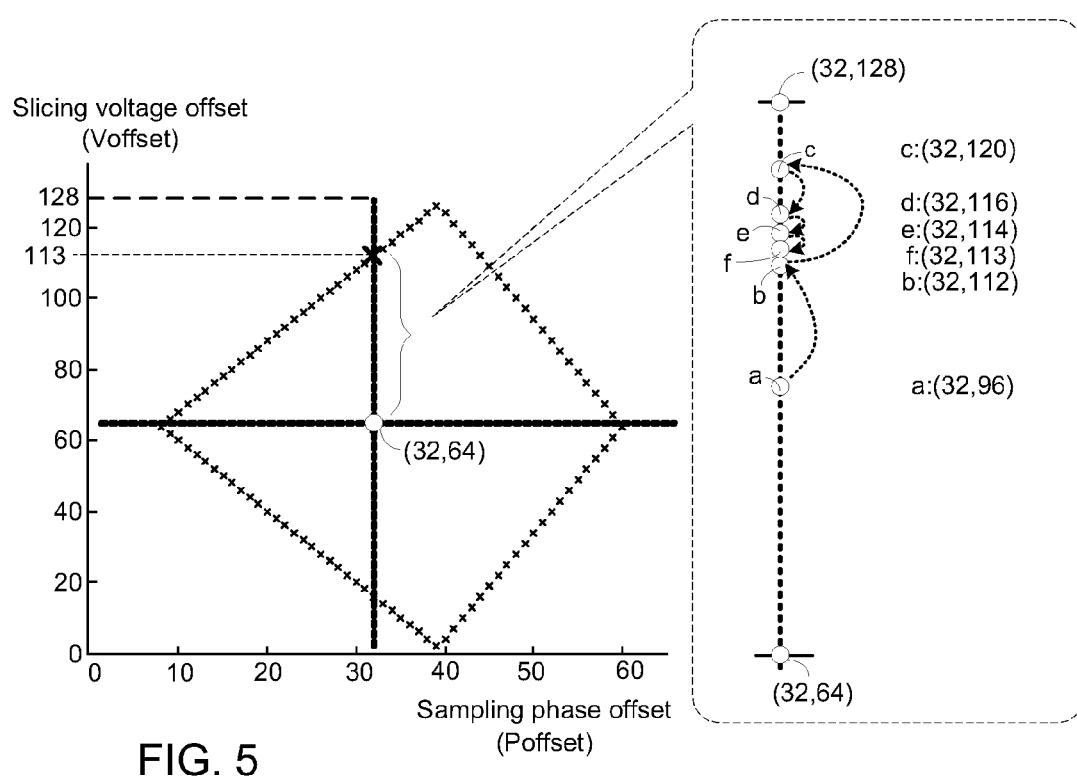
FIG. 5 schematically illustrates an example of an upper edge searching process of the eye diagram measuring method according to an embodiment of the present invention.

FIG. 5 schematically illustrates an example of an upper edge searching process of the eye diagram measuring method according to an embodiment of the present invention. By the upper edge searching process, an upper edge corresponding to the sampling phase offset Poffset=32 will be searched. Firstly, in the first initial condition a, the sampling phase offset Poffset is 32, the slicing voltage offset Voffset is 96, and an increment step is 16. Since the test signal Stest and the reference signal Sref are identical in the first initial condition a, the first initial condition a lies within the eye diagram boundary. Under this circumstance, the summation of the slicing voltage offset Voffset and the increment step (step=16) is used as a new slicing voltage offset Voffset (=112), i.e. a condition b.

In the condition b, the sampling phase offset Poffset is 32, and the slicing voltage offset Voffset is 112. Since the increment step is not equal to 1, the quotient from the division of the increment step by 2 is used as a new increment step (step=16/2=8). Since the test signal Stest and the reference signal Sref are identical in the condition b, the condition b lies within the eye diagram boundary. Under this circumstance, the summation of the slicing voltage offset Voffset and the increment step (step=8) is used as a new slicing voltage offset Voffset (=120), i.e. a condition c.

In the condition c, the sampling phase offset Poffset is 32, and the slicing voltage offset Voffset is 120. Since the increment step is not equal to 1, the quotient from the division of the increment step by 2 is used as a new increment step (step=8/2=4). Since the test signal Stest and the reference signal Sref are not identical in the condition c, the condition c is outside the eye diagram boundary. Under this circumstance, the difference between the slicing voltage offset Voffset and the increment step (step=4) is used as a new slicing voltage offset Voffset (=116), i.e. a condition d.

In the condition d, the sampling phase offset Poffset is 32, and the slicing voltage offset Voffset is 116. Since the increment step is not equal to 1, the quotient from the division of the increment step by 2 is used as a new increment step (step=4/2=2). Since the test signal Stest and the reference signal Sref are not identical in the condition d, the condition d is outside the eye diagram boundary. Under this circumstance, the difference between the slicing voltage offset Voffset and the increment step (step=2) is used as a new slicing voltage offset Voffset (=114), i.e. a condition e.

In the condition e, the sampling phase offset Poffset is 32, and the slicing voltage offset Voffset is 114. Since the increment step is not equal to 1, the quotient from the division of the increment step by 2 is used as a new increment step (step=2/2=1). Since the test signal Stest and the reference signal Sref are not identical in the condition e, the condition e is outside the eye diagram boundary. Under this circumstance, the difference between the slicing voltage offset Voffset and the increment step (step=1) is used as a new slicing voltage offset Voffset (=113), i.e. a condition f.

Since the increment step is equal to 1 in the condition f, the current slicing voltage offset Voffset (=113) is an upper edge corresponding to the sampling phase offset Poffset (=32).

Similarly, the lower edge corresponding to the sampling phase offset Poffset (=32) can be searched by performing the steps S415~427 of the lower edge searching process. It is noted that the initial condition, the change of the increment step and the threshold for judging the increment step are presented herein for purpose of illustration and description only. However, those skilled in the art will readily observe that numerous modifications and alterations of the initial condition, the change of the increment step and the threshold for judging the increment step may be made while retaining the teachings of the invention.

For example, after the upper edge and the lower edge corresponding to the previous sampling phase offset Poffset have been searched, the slicing voltage offset Voffset of the previous upper edge may be set as a first initial condition of the upper edge searching process for the next sampling phase offset Poffset, and the slicing voltage offset Voffset of the previous lower edge may be set as a second initial condition of the lower edge searching process for the next sampling phase offset Poffset. As a consequence, the upper edge and the lower edge can be searched more efficiently.

From the above descriptions, the present invention provides an eye diagram measuring circuit and an eye diagram measuring method. In a simplest eye diagram measuring method, the boundary determining unit 23 has to generate 64×128 kinds of conditions in order to obtain the eye diagram boundary. More especially, in an efficient eye diagram measuring method of the present invention, it is not necessary for the boundary determining unit 23 to scan all conditions of the 64 sampling phase offsets Poffset and the 128 slicing voltage offsets Voffset. In particular, the boundary determining unit 23 has to generate 64×2×log$_2$(64) kinds of conditions. As a consequently, the hardware complexity of the boundary determining unit 23 is largely reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An eye diagram measuring circuit, comprising:
    a reference signal generator for receiving and sampling an input signal and generating a reference signal;
    a clock data recovery circuit for generating a clock signal according to the reference signal;
    a test signal generator receiving the clock signal and the input signal, and generating a first sampling signal according to the clock signal, wherein the test signal generator discriminates logic levels of plural bits of the input signal according to the first sampling signal and a first slicing voltage, thereby generating a corresponding test signal; and
    a boundary determining unit receiving the test signal and the reference signal, and generating a boundary of an eye diagram according to a relationship between the test signal and the reference signal,
    wherein the boundary determining unit provides plural conditions to the test signal generator, and the test signal generator changes a phase of the first sampling signal and a magnitude of the first slicing voltage according to the plural conditions.

2. The eye diagram measuring circuit as claimed in claim 1, wherein the boundary determining unit comprises:
    an adjusting unit for inputting the plural conditions to the test signal generator according to a control signal;
    a judging unit for comparing the test signal with the reference signal, thereby generating a result signal; and
    a controlling unit for generating the control signal to control the adjusting unit to generate the plural conditions, and generating the boundary of the eye diagram according to the result signal and the plural conditions.

3. The eye diagram measuring circuit as claimed in claim 2, wherein the judging unit is an exclusive OR circuit, wherein if the test signal and the reference signal are identical, the result signal has a low logic level, wherein if the test signal and the reference signal are not identical, the result signal has a high logic level.

4. The eye diagram measuring circuit as claimed in claim 1, wherein each of the plural conditions comprises a sampling phase offset and a slicing voltage offset, wherein the eye diagram measuring circuit performs an edge searching process, and the edge searching process comprises steps of:
    (a) the boundary determining unit providing an initial of the slicing voltage offset to the test signal generator;
    (b) the test signal generator generating the first slicing voltage according to the slicing voltage offset, and discriminating the logic levels of the plural bits of the input signal according to the first sampling signal and the first slicing voltage, thereby generating the test signal;
    (c) judging whether the test signal and the reference signal are identical, wherein if the test signal and the reference signal are identical, a summation of the slicing voltage offset and an increment step is used to update the slicing voltage offset, wherein if the test signal and the reference signal are not identical, a difference between the slicing voltage offset and the increment step is used to update the slicing voltage offset; and
    (d) judging whether a magnitude of the increment step is larger than a threshold, wherein if the magnitude of the increment step is larger than the threshold, the magnitude of the increment step is reduced and then the step (b) is repeatedly done, wherein if the magnitude of the increment step is smaller than or equal to the threshold, the updated slicing voltage offset is a first edge of an eye diagram.

5. The eye diagram measuring circuit as claimed in claim 1, wherein each of the plural conditions comprises a sampling phase offset and a slicing voltage offset, and the test signal generator comprises:
    a slicing signal generator receiving the slicing voltage offset, and generating the first slicing voltage;
    a sampling signal generator receiving the sampling phase offset and the clock signal, and delaying the clock signal according to the sampling phase offset, thereby generating the first sampling signal;
    a first sampler for discriminating the logic levels of the plural bits of the input signal according to the first sampling signal and the first slicing voltage; and
    a first deserializer connected with the first sampler for converting the plural bits in a serial form into the test signal in a parallel form.

6. The eye diagram measuring circuit as claimed in claim 5, wherein the reference signal generator comprises:
    a delaying circuit for receiving the clock signal and delaying the clock signal by a fixed phase, thereby generating a second sampling signal;
    a second sampler for discriminating the logic levels of the plural bits of the input signal according to a fixed second slicing voltage and the second sampling signal; and
    a second deserializer connected with the second sampler for converting the plural bits in the serial form into the reference signal in a parallel form.

7. An eye diagram measuring method for an eye diagram measuring circuit, the eye diagram measuring circuit comprising a reference signal generator for converting an input signal into a reference signal, the eye diagram measuring method comprising steps of providing plural sampling phase offsets to a test signal generator, and changing a phase of a sampling signal according to the plural sampling phase offsets, wherein when each of the plural sampling phase offsets is provided to the test signal generator, an edge searching process is performed, and the edge searching process comprises steps of:
    (a) providing an initial of a slicing voltage offset to the test signal generator;
    (b) generating a first slicing voltage according to the slicing voltage offset, and discriminating logic levels of plural bits of the input signal according to the sampling signal and the first slicing voltage, thereby generating a corresponding test signal;
    (c) judging whether the test signal and the reference signal are identical, wherein if the test signal and the reference signal are identical, a summation of the slicing voltage offset and an increment step is used to update the slicing voltage offset, wherein if the test signal and the reference signal are not identical, a difference between the slicing voltage offset and the increment step is used to update the slicing voltage offset; and
    (d) judging whether a magnitude of the increment step is larger than a first threshold, wherein if the magnitude of the increment step is larger than the first threshold, the magnitude of the increment step is reduced and then the step (b) is repeatedly done, wherein if the magnitude of the increment step is smaller than or equal to the first threshold, the updated slicing voltage offset is a first edge of an eye diagram.

8. The eye diagram measuring method as claimed in claim 7, wherein when each of the plural sampling phase offsets is provided to the test signal generator, the eye diagram measuring method further comprises steps of:

(e) providing another initial of the slicing voltage offset to the test signal generator;

(f) generating the first slicing voltage according to the slicing voltage offset, and discriminating the logic levels of the plural bits of the input signal according to the sampling signal and the slicing voltage, thereby generating the corresponding test signal;

(g) judging whether the test signal and the reference signal are identical, wherein if the test signal and the reference signal are identical, a difference between the slicing voltage offset and another increment step is used to update the slicing voltage offset, wherein if the test signal and the reference signal are not identical, a summation of the slicing voltage offset and the another increment step is used to update the slicing voltage offset; and (h) judging whether the magnitude of the another increment step is larger than a second threshold, wherein if the magnitude of the another increment step is larger than the second threshold, the magnitude of the another increment step is reduced and then the step (f) is repeatedly done, wherein if the magnitude of the another increment step is smaller than or equal to the second threshold, the updated slicing voltage offset is a second edge of the eye diagram.

9. The eye diagram measuring method as claimed in claim 8, wherein if the first edge and the second edge are identical, the first edge and the second edge are a left edge or a right edge of the eye diagram.

10. The eye diagram measuring method as claimed in claim 8, wherein the first edges and the second edges corresponding to the plural sampling phase offsets are collaboratively defined as a boundary of the eye diagram.

11. The eye diagram measuring method as claimed in claim 8, wherein the first initial of the slicing voltage offset in the step (a) and the second initial of the slicing voltage offset in the step (e) are determined according to the first edge and the second edge obtained by a previous edge searching process.

* * * * *